US011424130B2

(12) United States Patent
Khan et al.

(10) Patent No.: US 11,424,130 B2
(45) Date of Patent: Aug. 23, 2022

(54) METHOD FOR SELECTIVE ETCHING OF NANOSTRUCTURES

(71) Applicant: ALIXLABS AB, Lund (SE)

(72) Inventors: Md Sabbir Ahmed Khan, Espoo (FI); Jonas Sundqvist, Gustavsberg (SE); Dmitry Suyatin, Lund (SE)

(73) Assignee: ALIXLABS AB, Lund (SE)

( * ) Notice: Subject to any disclaimer, the term of this patent is extended or adjusted under 35 U.S.C. 154(b) by 0 days.

(21) Appl. No.: 17/156,486

(22) Filed: Jan. 22, 2021

(65) Prior Publication Data

US 2021/0175087 A1 Jun. 10, 2021

Related U.S. Application Data

(63) Continuation of application No. 16/084,992, filed as application No. PCT/EP2017/055929 on Mar. 14, 2017, now Pat. No. 10,930,515.

(30) Foreign Application Priority Data

Mar. 15, 2016 (SE) .................................... 1630054-3

(51) Int. Cl.
*H01L 21/3065* (2006.01)
*H01L 29/66* (2006.01)
*H01L 29/775* (2006.01)
*H01L 29/06* (2006.01)
*H01L 21/306* (2006.01)
(Continued)

(52) U.S. Cl.
CPC ...... *H01L 21/3065* (2013.01); *B81C 1/00626* (2013.01); *B82Y 10/00* (2013.01);
(Continued)

(58) Field of Classification Search
None
See application file for complete search history.

(56) References Cited

U.S. PATENT DOCUMENTS 7,214,991 B2 5/2007 Yeo
8,865,007 B2 10/2014 Zhu
(Continued)

FOREIGN PATENT DOCUMENTS

FR 3009430 A1 2/2015
JP 2015023060 A 2/2015

OTHER PUBLICATIONS

A. Haab, et al. "Evolution and characteristics of GaN nanowires produced via maskless reactive ion etching", Nanotechnology, IOP, Bristol, GB, vol. 25, No. 25, Jun. 4, 2014, 11 pages.
(Continued)

*Primary Examiner* — Roberts P Culbert
(74) *Attorney, Agent, or Firm* — Brundidge & Stanger, P.C.

(57) ABSTRACT

The present invention relates to a method for selective etching of a nanostructure (10). The method comprising: providing the nanostructure (10) having a main surface (12) delimited by, in relation to the main surface (12), inclined surfaces (14); and subjecting the nanostructure (10) for a dry etching, wherein the dry etching comprises: subjecting the nanostructure (10) for a low energy particle beam (20) having a direction perpendicular to the main surface (12); whereby a recess (16) in the nanostructure (10) is formed, the recess (16) having its opening at the main surface (12) of the nanostructure (10).

14 Claims, 7 Drawing Sheets

(51) Int. Cl.
*H01L 21/308* (2006.01)
*B82Y 10/00* (2011.01)
*B81C 1/00* (2006.01)
*H01L 29/78* (2006.01)
*B82Y 40/00* (2011.01)

(52) U.S. Cl.
CPC .... *H01L 21/3086* (2013.01); *H01L 21/30621* (2013.01); *H01L 29/0673* (2013.01); *H01L 29/66439* (2013.01); *H01L 29/775* (2013.01); *H01L 29/785* (2013.01); *B82Y 40/00* (2013.01); *H01L 29/66795* (2013.01); *H01L 2029/7858* (2013.01)

(56) References Cited

U.S. PATENT DOCUMENTS

| | | | |
|---|---|---|---|
| 9,171,701 | B2 | 10/2015 | Zhu |
| 2008/0318032 | A1 | 12/2008 | Zhu et al. |
| 2009/0315153 | A1* | 12/2009 | Motoi ............... H01L 21/31144 257/618 |

OTHER PUBLICATIONS

J. Sundqvist, et al. "Why do we need Atomic Layer Etching?", https://www.researchgate.net/profile/Sabbir_Khan3/publication/289824086_Why_do_we_need_Atomic_Layer_Etching/links/5692df3408aed0aed816acda/Why-do-we-need-Atomic-Layer-Etching.pdf, Jan. 10, 2016, 1 page.

M. Noroozi et al. Fabrications of Size-Controlled SiGe Nanowires Using I-Line Lithography and Focused ion Beam technique, ECS Transactions, vol. 64, No. 6, Aug. 12, 2015, pp. 167-174.

S. Portal, et al. "Influence of incident ion beam angle on dry etching of silica sub-micron particles deposited on Si substrates", Thin Solids Films, vol. 518, No. 5, Oct. 1, 2009, pp. 1543-1548.

International Search Report and Written Opinion of PCT/EP2017/055929 dated Jun. 7, 2017, 12 pages.

Taiwanese Office Action (Notice of Second Review Opinion) Application No. Application No. 110129322, dated Apr. 13, 2022.

* cited by examiner

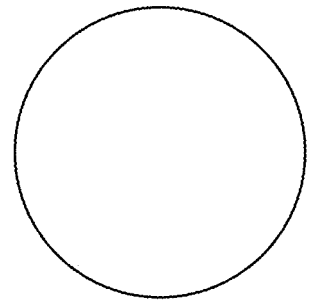
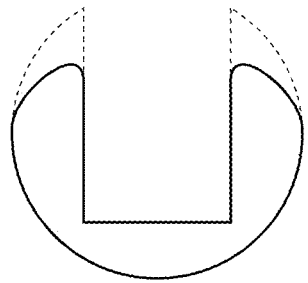
Fig. 3B  Fig. 3C
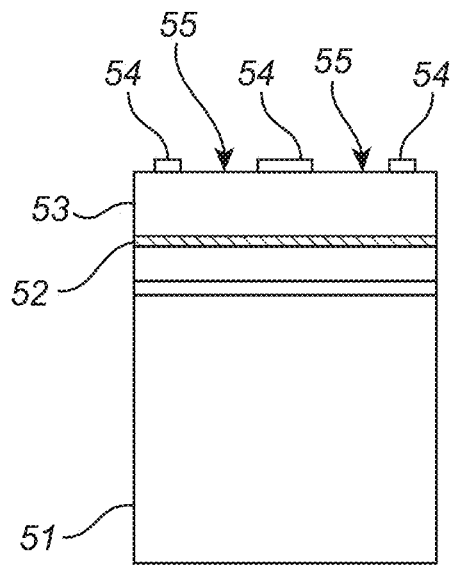
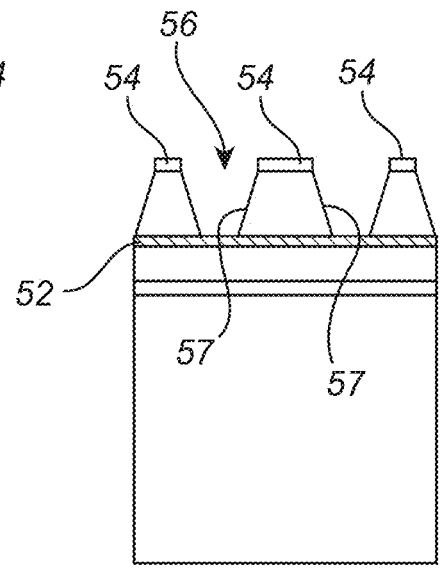
Fig. 4A  Fig. 4B
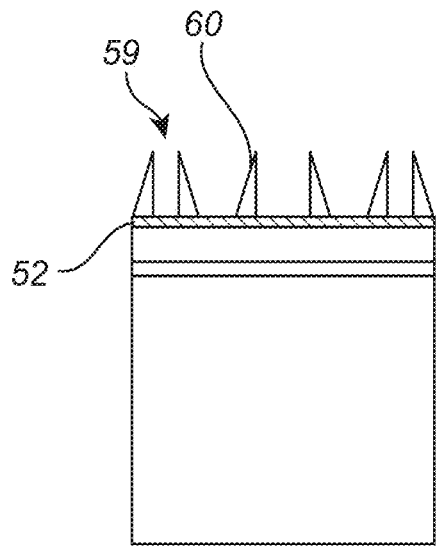
Fig. 4C

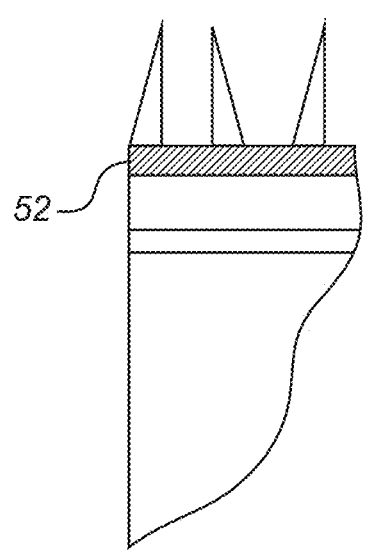
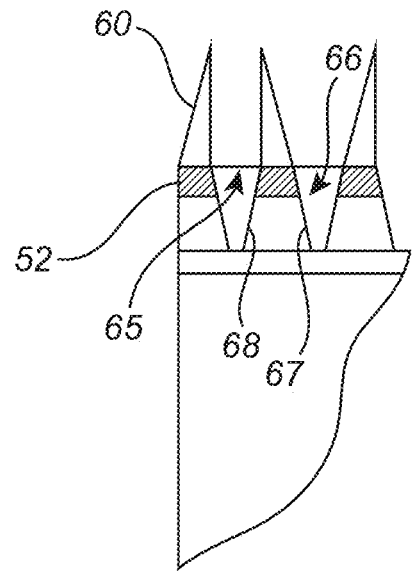
Fig. 5A  Fig. 5B
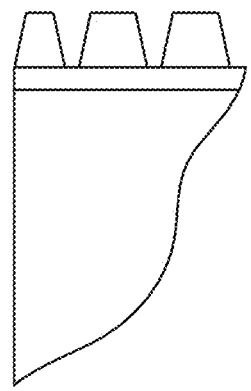
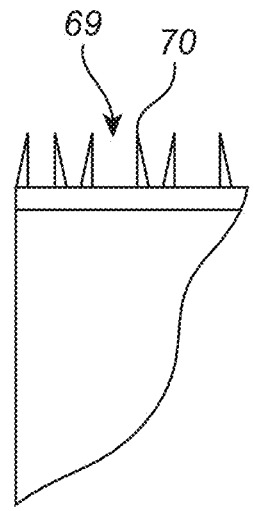
Fig. 5C  Fig. 5D

METHOD FOR SELECTIVE ETCHING OF NANOSTRUCTURES

CROSSED REFERENCE TO RELATED APPLICATIONS

The present application is a continuation of application Ser. No. 16/084,992, filed Sep. 14, 2018; which is the National Stage filing under 35 U.S.C. § 371 of PCT Application Ser. No. PCT/EP2017/055929, filed on Mar. 14, 2017, which claims the benefit of Sweden Patent Application No. 1630054-3 filed on Mar. 15, 2016. The disclosures of both applications are hereby incorporated herein by reference in their entireties.

TECHNICAL FIELD

The present invention relates to selective etching of nanostructures.

BACKGROUND OF THE INVENTION

The interest in manufacturing devices, e.g. advanced semiconductor devices, having dimensions below 100 nm have for the last decades been growing. Today a lateral size of advanced semiconductor devices, i.e. electronic components such as transistors, is already at and even below 20 nm. However, fabrication of structures with lateral size below 20 nm is hard to achieve with present processes. For instance, the spatial resolution of ultraviolet lithography, UVL, which is commonly used for manufacturing semiconductor devices in industry, is limited. Therefore, alternative novel approaches are required to overcome such challenges and to allow fabrication of nanostructures with lateral size below 20 nm.

SUMMARY OF THE INVENTION

In view of the above, it is an object of the present invention to provide a method for fabricating structures, especially semiconductor, in the sub 20 nm scale.

According to a first aspect, a method for selective etching of a nanostructure is provided. The method comprising:

providing the nanostructure having a main surface delimited by, in relation to the main surface, inclined surfaces; and subjecting the nanostructure for a dry etching, wherein etching comprises:

subjecting the nanostructure for a low energy particle beam having a direction perpendicular to the main surface;

whereby a recess in the nanostructure is formed, the recess having its opening at the main surface of the nanostructure.

In this context the phrase "nanostructure" is to be construed as a structure of intermediate size between millimeter scale structures and structures made of single atoms. The nanostructure is having at least one of its dimensions smaller than 150 nm. For instance, the width of an inclined surface is smaller than 150 nm.

In this context the phrase "low energy particle beam" is to be construed as a particle beam consisting of particles having an energy of less than 1000 eV, preferably less than 400 eV, more preferably less than 150 eV, even more preferably less than 100 eV. According to a specific embodiment the particles has an energy of less than 80 eV. Further, the particle energy may be more than 0.5 eV, preferably more than 5 eV, more preferably more than 10 eV. According to a specific embodiment the particles has an energy of more than 20 eV. According to another specific embodiment the particles has an energy of more than 60 eV. The preferred particle energy depends on the material of the nanostructure etched with this method. For example, silicon has the process window between 60 eV and 80 eV. Further, an energy spread of the particles of the particle beam may be less than 5 eV, preferably less than 1 eV. Hence, the particle energy may be less than an energy needed for sputtering, and the energy spread of the particles of the particle beam sufficiently narrow relative to the window of the etching process. Moreover, the particle energy may be less than an energy needed for generation of other types of defects in the nanostructure, such as broken atomic bonds and atoms knocked out of their lattice sites on the surface or in the bulk, in this way creating surface or bulk vacancies, adatoms or interstitials. This aspect of low energy for bombarding particles provides very gentle removal of the etched material as it generates less defects in the remaining material in comparison to etch processes, which employ higher energy particles.

In this context the phrase "perpendicular to the main surface" is to be construed as being parallel with a surface normal to the main surface within a deviation of ±20°, preferably within a deviation of ±10°. A particle beam having such a direction in relation to the main surface is believed to provide a selective etching process in line with the present invention for forming the recess. In addition, narrow angular distributions, preferably <20°, for the particles of the particle beam may also be desired.

Hence, a method of manufacturing nanostructures using selective etching at a main surface delimited by inclined surfaces is presented. The method is maskless. An etching rate at the main surface is substantial and an etching rate at the inclined surfaces is smaller than the etching rate at the main surface.

The inventive method is based on the surprising discovery made by the inventors that instead of a uniform etching the present method provides selective etching at certain surfaces of the nanoscale structure with a high selectivity. Hence, manufacturing of nanostructures with a lateral size below 20 nm may be provided with the present method. This without the use of or in combination with any lithography or multiple patterning. Hence, this method of manufacturing of nanostructures is maskless. Further, the present method allows for very gentle, ultimately damage free, processing of semiconductor devices and a precise nanofabrication below 20 nm.

The selective etching according to the present invention is a dry etching process in which low energy particles are used to remove material in a controlled way. The present invention is based on the surprising discovery that owing to the selectivity of that etching process to inclined surfaces, the inclined surfaces can be used as a mask or rather instead of a mask. In this way, side facets of tapered structures will provide masking during the dry etching process. The tapered structures can be readily fabricated by e.g., dry or wet etching or epitaxial growth. In addition, vertical surfaces and surfaces with negative inclination can be also used in this process as a mask since in this case any corner will be naturally rounded off during the etch process and then the inclined surface of the rounded corner will act as a mask for the etch process. That is why this method provides maskless fabrication of extremely small structures in a very precise and efficient way. Hence, the present method enables maskless nanostructure fabrication in a simple (less number of processing steps, no need in additional lithography steps and masks, more freedom in electronic components design), economical (smaller investment for pattering and processing equipment due to a smaller number of process steps, smaller size features without additional investment in equipment development, overall higher throughput) and gentle way (ultimately damage free) as it relies only on changes in processing steps and processing parameters to be used in already available processing systems. Some leading edge etch equipment that may be used for performing the inventive method are listed below:

Centris advantegde, Centris Sym3 etch, Centura Advantedge, Centrura Avatar Etch, Centrura Silvia Etch, Centura Tetra EUV, Centura Tetra Z, Producer Etch, or Producer Selectra Etch by the manufacturer Applied Materials.

Any etch product from the manufacturer LAM Research, i.e. an etch product from the Kiyo® Product Family or from the Versys® Metal Product Family.

Telius SP, Tactras, UNITY Me, Certas LEAGA, or Certas WING from the manufacturer Tokyo Electron.

Conductor Etch System 9000 Series, Conductor Etch System M-8000 Series, Conductor Etch System M-600/600 Series, Non-Volatile Materials Etch System E-600/8000 Series, or Magnetic Head Etch System E-6000 Series by the manufacturer Hitachi High-Technologies.

Thus, already established semiconductor fabrication plants can be used for further device downscaling enabled by the present method just by changing the process flows and process parameters. The present method provides fabrication of extremely small structures in a very precise and efficient way. The present method does not suffer from mask alignment problems, which may prove crucial for extremely scaled devices below 7 nm. Moreover, an additional benefit with the present method is that the number of steps needed in processing is reduced as e.g. compared with lithography processes. This provides a substantial reduction for the final devices production costs as lithography steps are the main cost drivers for semiconductor manufacturing. In addition, electronic circuits design costs are also expected to be reduced as this invention adds a new degree of process design freedom and makes processing easier, with fewer steps.

Further, the present method allows overcoming the resolution limit of optical lithography by making smaller structures out of structures fabricated with e.g. Deep Ultra Violet, DUV, immersion lithography or Extreme ultraviolet, EUV, lithography. Hence, the present invention provides e.g. for production of nanowire Gate-all-Around field effect transistors.

Hence, the present inventive method meets the need for economically viable path for high volume manufacturing of leading edge semiconductor devices, such as those, which can be seen in modern logic and memory systems. The saving potential by the present invention is valid for existing semiconductor fabrication plants even for present technology nodes as the number of lithography steps needed will go down to 50% of what is currently used. This due to that in current technology two lithographic steps are used but one lithographic step is used in the current method. Furthermore, the etch-deposition cycles, which are needed for self-aligned double patterning and self-aligned quadruple patterning, and which are typically done in different processing chambers, may be completely removed by the method invented. This may further substantially increase the device production throughputs since the processing time for advanced devices is dominated by transfer times into and out of the different processing equipment, this provides an additional benefit for this invention. In addition, the present invention will provide substantial savings for the next technology nodes introduction due to a prolonged lifetime of already installed equipment and a much lower investment needed for new leading edge semiconductor fabrication plants. This will facilitate further sustainable semiconductor device downscaling and the overall technology development by enabling cheaper and more powerful devices without substantial additional investments.

An etching rate at the main surface may be larger than an etching rate at the inclined surfaces.

An inclination angle for the inclined surfaces in relation to the main surface may be larger than 10°, preferably larger than 20°.

An inclination angle for the inclined surfaces in relation to the main surface may be larger than 50°.

An inclination angle for the inclined surfaces in relation to the main surface may be larger than 60°.

An inclination angle for the inclined surfaces in relation to the main surface may be 60°.

The inclined surfaces may be curved in cross-section with the inclination angle continuously changing in relation to the main surface. In this case only parts of curved surfaces which have angles within a specific range will have etching rate sufficiently lower than the etching rate for the main surface.

These inclined curved surfaces may be formed by rounding off corners of the original structure by the same dry etch process or by a dedicated etch process which can be performed separately or simultaneously.

These inclined curved surfaces may be formed by rounding off angles between the inclined surfaces and the main surface where the angle is between 85° and 90°. This rounding off may be done by the same dry etch process or by a dedicated etch process which can be performed separately or simultaneously.

These inclined curved surfaces may be formed by rounding off angles between the inclined surfaces and the main surface where the angle is larger than 90°, in this way negative slope profiles could be used and after application of the invented method this may e.g. enable suspended structures, e.g. suspended nanowires. The rounding off may be done by the same dry etch process or by a dedicated etch process which can be performed separately or simultaneously.

The dry etching process may be any etching process in which low energy particles bombard the structure in direction perpendicular to the main surfaces.

The dry etching process may be a cyclic process in which a certain layer is etched in each cycle. The cyclic process may be an atomic layer etching process in which an atomically or subatomically thin layer is etched in each cycle.

After the etch process an annealing may be used to reduce defects in the remaining structure. Further, the etch process may be performed at a reduced temperature. Reduced temperature may be important in order to reduce the generation of defect as structure temperature may directly affect the dynamics of defect formation, especially for ion energies below 100 eV, in spite the fact that thermal energies of the target atoms in the structure are <0.1 eV. This ultimately may lead to damage free structures after the annealing. Reduced substrate temperature may also improve the lateral resolution as cooling the substrate e.g. suppresses chemical etching and in this way makes etching more anisotropic.

Each cycle of the cyclic etching may further comprise: subjecting the nanostructure for surface modification by chemisorption, deposition, conversion or extraction.

For each cycle of the cyclic etching the subjecting of the nanostructure for surface modification may be performed before subjecting the nanostructure for the particle beam.

The particle beam may comprise ions. The particle beam may comprise ions of a noble gas. The particle beam may consist of Ar ions.

The particle beam may be generated by plasma. The particle beam may be generated by Ar plasma. The particle beam may be generated by plasma in a system for reactive ion etching.

The recess may be a channel in the nanostructure. For example, the recess may be forming part of a set of channels in the nanostructure.

The recess may be a through hole in the nanostructure. For example, the recess may be forming part of a set of through holes in the nanostructure.

The nanostructure may have a hexagonal cross section taken in plane perpendicular to the main and inclined surfaces.

The nanostructure may be a nanowire having a diameter smaller than 80 nm, preferably smaller than 60 nm.

A wall thickness of a wall in the nanostructure formed by the selective etching of the recess may be smaller than 20 nm. Hence, at least one dimension of the etched structure is smaller than 20 nm.

The method may be used for forming a transistor gate channel, such as a Gate All Around Field Effect Transistor, GAAFET, with nanowire gate channel. Further, the method may be used for forming a FinFET, planar transistors, contact holes, lines.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description.

Hence, it is to be understood that this invention is not limited to the particular component parts of the device described or steps of the methods described as such device and method may vary. It is also to be understood that the terminology used herein is for purpose of describing particular embodiments only, and is not intended to be limiting. It must be noted that, as used in the specification and the appended claim, the articles "a," "an," "the," and "said" are intended to mean that there are one or more of the elements unless the context clearly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

The above and other aspects of the present invention will now be described in more detail, with reference to appended drawings showing embodiments of the invention. The figures should not be considered limiting the invention to the specific embodiment; instead they are used for explaining and understanding the invention.

As illustrated in the figures, the sizes of layers and regions are exaggerated for illustrative purposes and, thus, are provided to illustrate the general structures of embodiments of the present invention. Like reference numerals refer to like elements throughout.

FIG. 3B is a schematic cross section along the line A-A in FIG. 3A, before the nanostructure, in the form of a Si nanowire, being subjected for the method of FIGS. 1A and 1B.

FIG. 3C is a schematic cross section along the line A-A in FIG. 3A.

FIGS. 4A, 4B and 4C show successive steps in using the method according to FIGS. 1A and 1B for providing a nanostructure provided with fins with a double pitch.

FIGS. 5A, 5B, 5C and 5D show successive steps in using the method according to FIGS. 1A and 1B for providing a nanostructure provided with fins with a quadruple pitch.

DETAILED DESCRIPTION

Figure 1A:
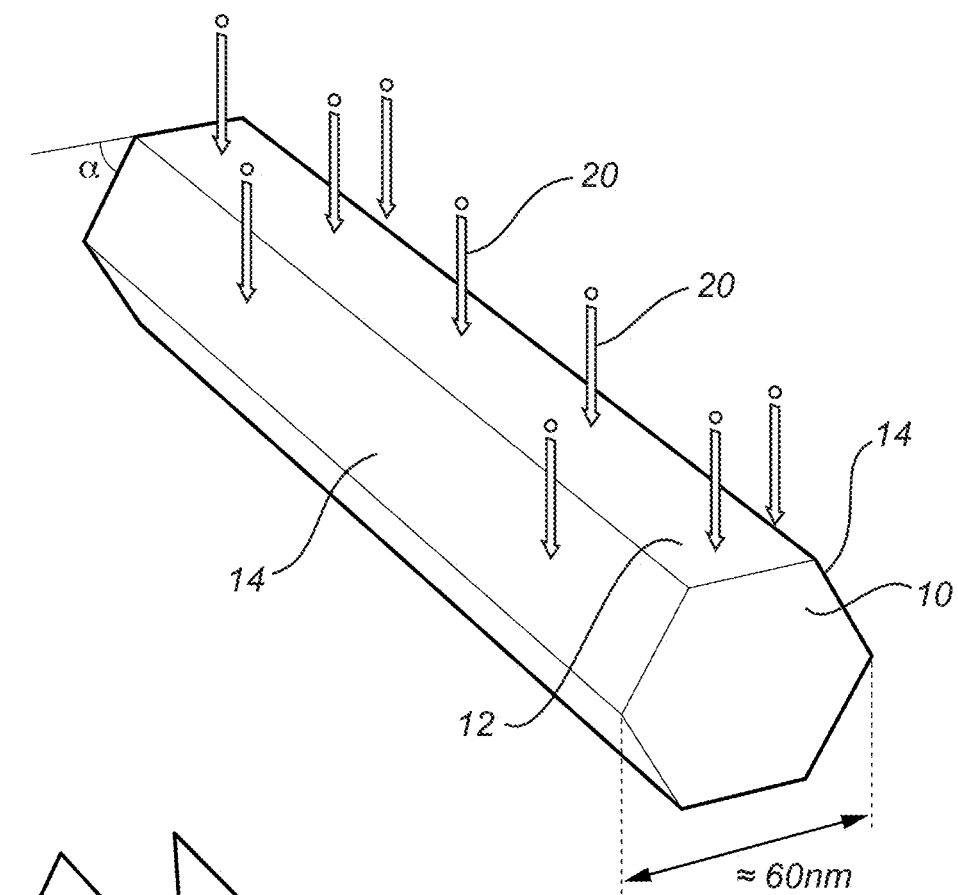
FIGS. 1A and 1B schematically illustrate a method for selective etching of a nanostructure.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and to fully convey the scope of the invention to the skilled person.

The present invention is directed towards selective etching of nanostructures. The inventors have surprisingly discovered that by subjecting a nanostructure, with in relation to each other inclined surfaces, for dry etching with a particle beam being substantially perpendicular to a main surface of delimited by inclined surfaces, a recess is formed between the inclined surfaces. The particle beam etches the structure surface less when the angle towards the particle beam is smaller or larger than 90°. Thus, the inclined surfaces are left substantially un-etched and the main surface, intermediate the inclined surfaces, is etched.

Dry etching methods suitable for this inventive method of etching with a particle beam are continuous etching methods or cyclic etching methods. Examples of continuous etching methods are low energy particle beam sputtering, for example with Ar ions, and low energy particle beam continuous reactive ion etching, for example with Ar and $Cl_2$ gases. And examples of cyclic etching methods are Atomic Layer Etching, ALE, and non-ideal ALE. Here non-ideal ALE refers to different processes with process parameters similar to those of ideal ALE but somewhat different, e.g. outside of saturation regions, which means non-self-limiting process behavior. The non-ideal ALE may provide a faster etch process at the expense of process stability and may be preferred in some cases. Below ALE will be used as an example. Before introducing the inventive method, some basics of ALE will be discussed.

ALE has been studied for almost 30 years. Pioneering work was presented in U.S. Pat. No. 4,756,794 A1. ALE has been referred to by different names, such as Plasma Atomic Layer Etching (PALE), Layer-by-Layer Etching, Digital Etching, Single Layer Etching, Atomic Layer Removal, Molecular Bilayer Etching and Thin Layer Etching. Different ALE names and corresponding references has been listed by Kanarik et al. in "Overview of atomic layer etching in the semiconductor industry" J. Vac. Sci. Technol., 33(2), 2015. Until today more than 20 materials have been inspected using ALE including silicon, III-V semiconductor materials, different oxides, 2D materials and some polymers; a list of inspected materials has been listed by Oehrlein et al. in "Atomic layer etching at the tipping point: An overview" Journal of Solid State Science and Technology, 4(6), 2015.

ALE is a cyclic etch process in which a well-defined atomically thin layer is etched in each cycle. ALE is cost-effective for advanced semiconductor devices since the amount of material being removed is readily measured in atomic layers, or even subatomic layers, which provides atomic level control over etching process, this is critical for the leading edge devices. The process is well controlled due to a self-limiting nature of the basic steps in the ALE process.

Typically, the ALE process comprises two major steps: surface modification and removal of the modified surface layer. There are also typically two intermediate steps comprising: purging the remaining gases after the surface modification and purging the remaining byproducts after the removal of the modified layer.

The surface modification may be performed in various ways dependent upon the material of the nanostructure to be etched and what removal process step that is to be used. The surface modification may e.g. be made by one of chemisorption, desorption, conversion or extraction. A well-defined thin layer is formed on the surface by the surface modification. This thin layer is easier to etch than unmodified material, which leads to the selective material removal.

Removal of the modified surface layer may be made in various ways. The most common way is particle bombardment using a particle beam. Typically, the particle beam comprises atoms or molecules of an inert gas, such as argon, AR, or neon, Ne. The atoms or molecules may also be ionized, hence, the particle beam may be an ion beam. The use of a particle beam for removal of the modified surface layer leads to an anisotropic etching process. Other methods used during ALE for removal of the modified surface layer are thermal desorption and chemical reaction, both which are isotropic approaches.

ALE may e.g. be performed using an ICP-RIE system Plasmalab-100, from Oxford Instruments. Other systems that may be used are listed above under the summary of invention section.

Figure 1B:
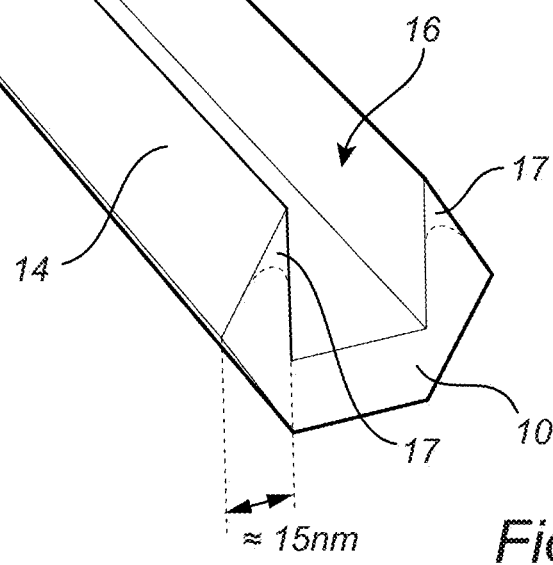

The principle of a method according to the present invention for selective etching of nanostructures will now be discussed in connection with FIGS. 1A and 1B. In FIG. 1A a nanostructure 10 is subjected for a low energy particle beam 20 having a direction perpendicular to a main surface 12 of the nanostructure 10. The subjection of the nanostructure 10 for the low energy particle beam 20 is part of a dry etching process. The dry etching process may e.g. be a cyclic ALE process. In the case of ALE the subjecting the nanostructure 10 for the low energy particle beam 20 is used as the act in the ALE of removal of the modified surface layer by particle bombardment. In FIG. 1B the same nanostructure 10 as in FIG. 1A is shown after being subjected for the dry etching for a period of time, in the case of ALE, for a plurality of succeeding cycles in the cyclic ALE process.

The particle beam has a direction perpendicular to a main surface 12 of the nanostructure 10. The main surface 12 is delimited by at least two, in relation to the main surface 12, inclined surfaces 14. The inclined surfaces 14 may be downwardly or upwardly inclined in relation to the main surface. The inclined surfaces 14 may also be referred to as facets surfaces of the nanostructure 10. Hence, the particle beam has a direction which is substantially perpendicular to the main surface 12 of the nanostructure 10.

It shall be understood that direction of the particle beam in relation to the main surface 12 may deviate by as much as ±10° from being strictly perpendicular and still selective etching will occur. The selective etching will be discussed in more details below.

As mentioned above in the case of ALE, in between FIGS. 1A and 1B the nanostructure 10 has been subjected to a number of cycles in the cyclic ALE process. In the in FIGS. 1A and 1B example the nanostructure is in the form of a hexagonal nanowire. However, it is contemplated that other types of nanostructures also may be subjected for the method according to the present invention. The inclination angle α for the inclined surfaces 14 in relation to the main surface 12 may be larger than 10°, preferably larger than 20°.

As is illustrated in FIG. 1B, by subjecting the nanostructure for the dry etching, selective etching of the main surface 12 is achieved. This is surprising since it was expected that a uniform etching should occur. The selective etching forms a recess 16 in nanostructure 10. The recess 16 is having its opening at the main surface 12 of the nanostructure 10.

It is shall be noted that FIGS. 1A and 1B show a small portion of an elongated structure. Thus, the longitudinal ends of the structure are not shown in FIGS. 1A and 1B.

It shall be also noted that typically sharp corners 17 of the etched nanostructure 10 will be naturally rounded off during the etch process as shown in FIG. 1B.

In case of the dry etching being ALE, each cycle of the ALE process also comprises subjecting the nanostructure 10 for surface modification. The surface modification may be any one of chemisorption, deposition, conversion or extraction. In a preferred embodiment the surface modification is made using chemisorption of chlorine gas. For each cycle of the ALE the subjecting of the nanostructure 10 for surface modification is preferably performed before subjecting the nanostructure 10 for the removal of the modified layer.

Typically, each cycle of the ALE process also comprises one or more intermediate steps. Two non-limiting examples of such intermediate steps are: purging the remaining gases after the surface modification and purging the remaining byproducts after the removal of the modified layer.

During the ALE it is believed that particle interaction with a surface of the nanostructure 10 depends on the impingement angle. Further, it is believed that particle interaction with the surface of the nanostructure depends on the energy of the particle beam. The energy of the particle beam is determined by the energy of the incoming particles and on the local electric field at the nanostructure. It is believed that corners of the nanostructure 10, i.e. formed at the crossing between the main and inclined surfaces 12, 14, and the broken edges of the nanowire in the example given in FIGS. 1A an 1B, may change the local electric field. As a result, the particles used at the removal of the surface modified layer cannot transfer sufficient energy to the corners. Accordingly, the corners may act as a mask during the ALE process.

Furthermore, corners of nanostructure 10, i.e. sharp corners 17 of the etched nanostructure 10 and the broken edges of the nanowire in the example given in FIGS. 1A an 1B, will be naturally rounded off during the etch process and then the inclined surface of the rounded corner will act as a mask for the etch process. Hence, an etching rate at the main surface 12 will be much higher than an etching rate at the inclined surfaces 14 and corners. This result in that the recess 16 is formed in the nanostructure 10 by cyclically subjecting the nanostructure 10 for the ALE process.

Figure 2A:
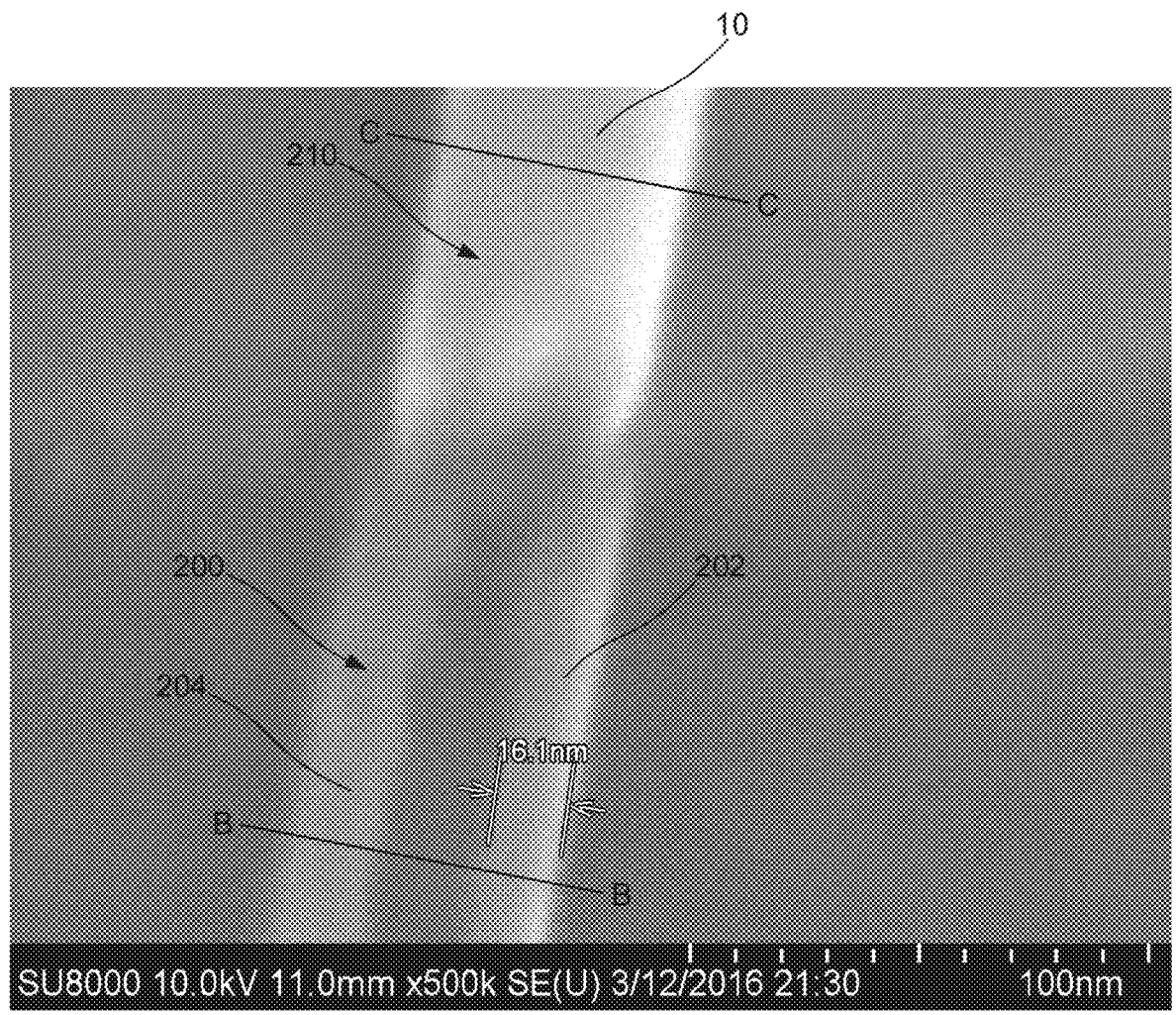
FIG. 2A is Scanning Electron Microscopy, SEM, image of a nanostructure, in the form of a GaP nanowire, being partly subjected for the method of FIGS. 1A and 1B.
Figures 2B, 2C:
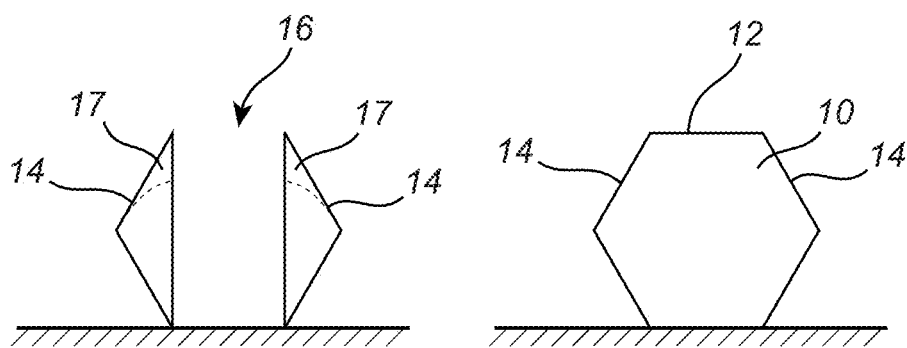
FIG. 2B is a schematic cross section along the line B-B in FIG. 2A.
FIG. 2C is a schematic cross section along the line C-C in FIG. 2A.

By continuing the cyclic ALE process, the nanostructure 10 may be split in two nanostructures as shown in FIG. 2B. Hence, by subjecting the nanowire shown in FIGS. 1A and 1B for even further cycles of the ALE process the nanowire may be split in two thin nanowires. By subjecting the structures for even further cycles of the ALE process these two thin nanowires may be used as a mask for etching underlying material.

The recess 16 may form a channel in the nanostructure. This is illustrated in FIG. 1B. However, as discussed above, by continuing the ALE process the recess 16 may alternatively form a through hole in the nanostructure 10 splitting the nanostructure 10 in two.

Giving a more detail view on the example disclosed in connection with FIGS. 1A and 1B. A nanowire having hexagonal cross-section is arranged in a horizontal position, with a main etch surface 12 being horizontal, the main etch surface 12 being surrounded by two inclined surface 14 having an angle α of 60° in relation to the horizontal main surface 12. The nanowire is exposed to ALE. Again, it is believed that the corners change the local electric field and at least partially prevent particle (in a specific embodiment the particles are ions) interaction and energy transfer for removal of a (atomic/subatomic) layer. Repetition of the ALE process results in formation of the recess as shown in FIG. 1B. The structure disclosed in FIG. 1B may be used as an improved nanowire gate or as a mask for etching transistor channel. Further etching will result in the division of the nanowire into two narrow nanowires.

The inventive method may be used on a variety of different nanostructures. Some non-limiting examples are: GaP nanowires, Si nanowires. Other examples are structures being exposed to lithographic patterning and (wet or dry) etching.

GaP nanowires may be grown by Metal Organic Vapor Phase Epitaxy, MOVPE, from seed catalyst nanoparticles, e.g. gold seed particles, on GaP substrates. Si nanowires may be grown on Si substrates with random crystallographic orientation. The GaP and Si nanowires may after growth be mechanically transferred to a Si surface and then etched with the inventive method.

The inventive method has been experimentally proven for nanowires having diameter in the interval of 40 nm to 110 nm. However, it is believed that the same operation will occur at smaller diameters down to 10 nm and below. The method may of course also be used for other nanostructures than nanowires. Moreover, the method may be used at larger structures than what was exemplified directly above. The method may be used by ALE or by any other dry etching method using a particle beam for etching.

The inventors have been performing a number of experiments using the inventive method.

In FIG. 2A. a Scanning Electron Microscopy, SEM, image of a nanostructure 10, in the form of a GaP nanowire, being partly subjected for the inventive method is shown. The GaP nanowire has a diameter of approximately 60 nm and a hexagonal cross-section. The nanowire is partially covered by a suspended mask. As seen in the SEM image, a part 200 of the GaP nanowire that has been subjected for the inventive method has been selectively etched forming two narrow nanowires 202, 204. The width of the respective narrow nanowire 202, 204 is approximately 16 nm. This is also illustrated in the schematic cross section of the nanowire taken along the line B-B and shown in FIG. 2B. Hence, after subjecting the GaP nanowire for the inventive method an individual nanowire is split into two separate thinner nanowires 202, 204. In this case atomic layer etching with 105 cycles has been performed.

Further, as is illustrated in FIG. 2B the sharp corner 17 at the top will become gently rounded as indicated by broken lines in FIG. 2B. This is because a structure of a few nanometers cannot easily maintain a sharp corner, but the particle beam will influence upon the sharp corner and round it off.

Further, as seen in the SEM image, the part 210 of the GaP nanowire that has not been subjected for the inventive method is still unaffected. This is also illustrated in the schematic cross section of the nanowire taken along the line C-C and shown in FIG. 2C. This schematic cross section showing the typical hexagonal shape for the GaP nanowire.

Figure 3A:
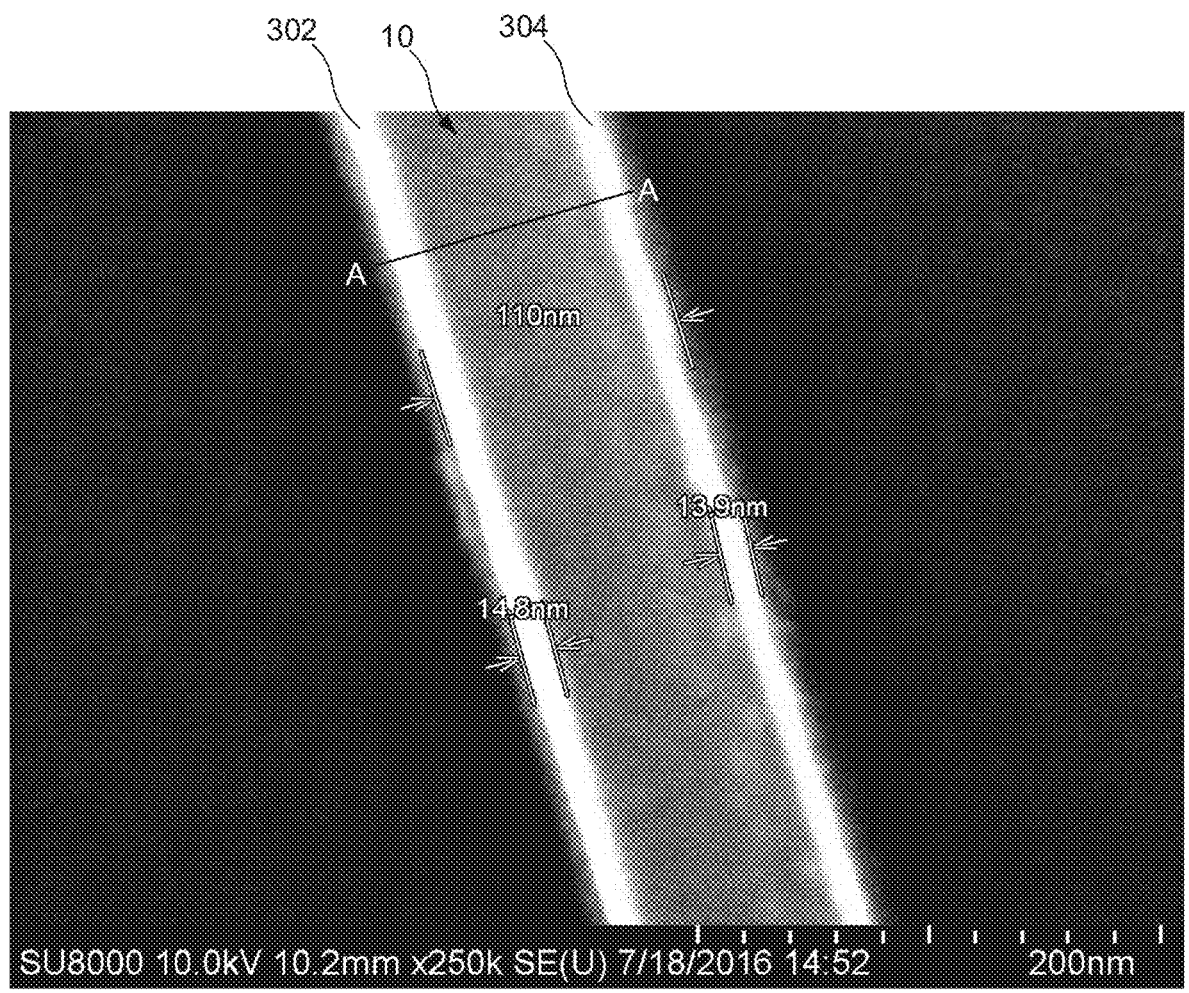
FIG. 3A is SEM image of a nanostructure, in the form of a Si nanowire, being subjected for the method of FIGS. 1A and 1B.

In FIG. 3A a SEM image of a nanostructure 10, in the form of a Si nanowire, being subjected for the inventive method is shown. The Si nanowire has a diameter of approximately 110 nm and a substantially circular cross-section. As seen in the SEM image, the Si nanowire subjected for the inventive method has been selectively etched forming two narrow nanowires 302, 304. The width of the respective narrow nanowire 302, 304 is approximately 14 nm. In this case atomic layer etching with 105 cycles has been performed.

FIG. 3B is a cross-section taken along line A-A in FIG. 3A of the nanowire before it has been exposed to the dry etching process and FIG. 3C is a cross-section after exposure for the dry etching process. As is shown in FIG. 3C by broken lines, the sharp corners are gently rounded.

FIG. 4A shows a silicon substrate 51 provided with a hardmask 52 and an epitaxially grown layer 53 thereon. A photoresist layer 54 is patterned by a lithographic method, exposing areas 55 of layer 53. An etching agent is provided and etches the exposed areas as shown in FIG. 4B to provide recesses 56 having inclined surfaces walls 57. Finally, the photoresist material 54 is removed and the exposed ridges of the layer 53 between the recesses 56 are subjected to dry etching in accordance with the present inventive method. Recesses 59 are formed between the inclined surfaces 57 by the dry etching process, leaving a structure provided with fins with inclined surfaces 60 with a very narrow pitch. This process is called litho-etch-etch, LEE.

A further division of the structure of FIG. 4C may be performed according to FIGS. 5A, 5B, 5C and 5D.

In FIG. 5A, the hard mask 52 is removed between the fins 60 and the exposed areas 65 are etched to provide recesses 66 having tapering walls 67 and 68 as shown in FIG. 5B. The remaining hard mask 52 and the fins 60 are removed as shown in FIG. 5C. The exposed ridges are subjected to dry etching in accordance with the present inventive method, whereby recesses 69 are formed leaving a structure provided with fins 70 with a still more narrow pitch—half of the one according to FIG. 4C. This process is called litho-etch-etch-etch-etch-etch, LEEEEE.

These processes have the advantages of only one litho exposure, no deposition required and all etch processes can be performed on one cluster without vacuum break and potentially even without mechanical transfer to another chamber.

Figure 6:
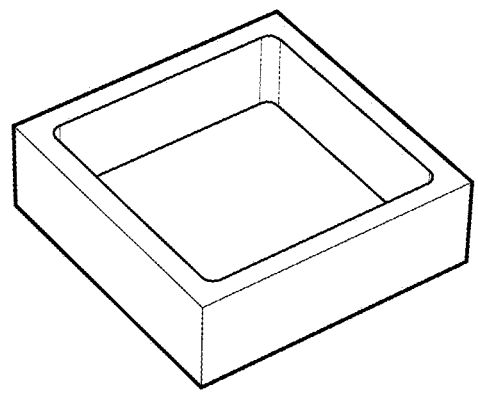
FIG. 6 is a schematic view of a nanostructure, which is substantially rectangular and is exposed for the method according to FIGS. 1A and 1B.

FIG. 6 shows a structure which is not elongated but has a substantially square extension. By exposing the top surface thereof for the method according to the present invention, a box structure is formed, which may be used for example for connection lines. The structure may alternatively be circular or triangular or having any geometric shape required.

The structure is provided with a substantially planar top surface limited by inclined surfaces.

Figure 7:
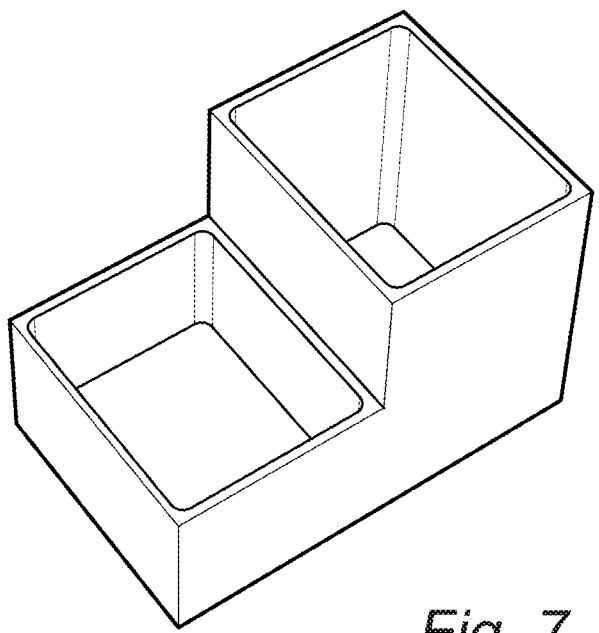
FIG. 7 is a schematic view of another nanostructure, which is comprises two substantially rectangular surfaces and is exposed for the method according to FIGS. 1A and 1B.

FIG. 7 shows a structure having two planar and parallel surfaces being connected by a vertical wall. At exposure for the present method, two recesses are formed delimited by the inclined surfaces. The bottom surface is delimited by a surface inclined downwards and a surface inclined upwards.

For the above mentioned experiments the GaP nanowires were fabricated using gold aerosol particles as growth catalysts on GaP (111) substrates using MOVPE. The detail of GaP nanowires fabrication process can be found elsewhere, see e.g. Dmitry B Suyatin, et al. "Gallium phosphide nanowire array and their possible application in cellular force investigation"; Journal of Vacuum Science and Technology B, 27(6), 3092-3094, 2009. The GaP nanowires were mechanically transferred on a silicon surface before performing the inventive method.

For the above mentioned experiments the Si nanowires were grown on Si substrates with random crystallographic orientation. The detail of Si nanowires fabrication process can be found elsewhere, see e.g. Walter M. Weber, et al. "Silicon nanowires: catalytic growth and electrical characterization", phys. stat. sol. (b) 243, No. 13, 3340-3345, 2006. The Si nanowires were mechanically transferred on a Silicon surface before performing the inventive method.

Oxford Instruments Plasmalab 100 were used for the ALE process. The surface modification was made using chemisorption of $Cl_2$. The subsequent removal of the modified surface layer was made using an Ar plasma. During the ALE-process the sample carrier was maintained at room temperature. The cyclic ALE-process was performed by cyclically performing the following four steps with the process parameters listed in connection with each step:
  a) Surface modification with $Cl_2$: Ar flow=0 sccm; $Cl_2$ flow 20 sccm; pressure=30 mTorr; time=20 s.
  b) Purging: Ar flow=40 sccm; $Cl_2$ flow 0 sccm; pressure=30 mTorr; time=10 s.
  c) Removal step with Ar ions: RF 25 W; Ar flow=10 sccm; $Cl_2$ flow 0 sccm; pressure=3 mTorr; time=10 s.
  d) Purging: Ar flow=10 sccm; $Cl_2$ flow 0 sccm; pressure=30 mTorr; time=2 s.

The steps a)-d) where cyclically repeated. The etching rate was established to be approximately 2 Å/cycle. The SEM images was acquired using Hitachi SU8010 and LEO 1560 SEMs.

The above experimental results demonstrate that the method according to this invention e.g. enables splitting of individual transistor channels in a simple and inexpensive way. This may accelerate and facilitate further downscaling of electronic devices.

Overall, the method of nanostructure fabrication using the method according to the present invention is potentially a damage-free dry etch process. Owing to the selectivity of the etching process to etch non-inclined surfaces, the inclined surfaces and corners of nanostructures may be used as a mask and in this way side facets of tapered structures, which can be readily fabricated by e.g., dry etching or epitaxial growth, will provide masking during the atomic layer etching process. This is why this process provides access to fabrication of extremely small structures in a very precise, controlled and efficient way.

The person skilled in the art realizes that the present invention by no means is limited to the preferred embodiments described above. On the contrary, many modifications and variations are possible within the scope of the appended claims.

For example, different particles may be used for the particle beam. According to a non-limiting example, the particle beam may comprise Ar ions.

The above listed parameters and instrument were used for the above described experiments. It is however contemplated that the inventive method may be performed using other instruments and/or other parameters as well. For example, the pressures, the flow of Ar, the flow of $Cl_2$ and/or the times may be varied. Further, the inventive method will also work using other types of surface modification steps and/or other types of removal steps. The surface modification may be made using such gases as $Cl_2$, $BCl_3$, $O_2$, $H_2$, $CF_4$, $CHF_3$, $C_2F_6$, $C_3F_6$, $C_4F_8$, $CHF_3$, $SF_6$, $NF_3$ and mixtures thereof. The choice of gas depends on the material of the nanostructure. The removal of the surface modified layer may be made using other gases than Ar, e.g. other inert gases such as Ne. Using e.g. Ne may be beneficial when processing e.g. nanostructures of silicon since it has a smaller mass than silicon.

In addition, the surface of the nanostructure subjected for dry etching according to the inventive method may be additionally modified before the dry etching process in order to increase the etch selectivity. This modification process may be represented, but not limited, by surface passivation or coating with e.g. oxide coating, nitride coating or gas phase doping.

The method according to the present invention may be used for manufacturing of different nanoscale devices. According to a non-limiting example, the method may be used for recessing FinFET gate channels. According to anther non-limiting example, the method may be used for forming and/or modifying a transistor gate channel, such as a GAAFET nanowire gate channel.

Additionally, variations to the disclosed embodiments can be understood and effected by the skilled person in practicing the claimed invention, from a study of the drawings, the disclosure, and the appended claims.

What is claimed is:

1. A method for forming a nanostructure, the method comprising:
  providing a substrate having a first layer and a resist layer, wherein the first layer is between the resist layer and the substrate;
  lithography patterning the resist layer, thereby exposing areas of the first layer;
  etching the exposed areas of the first layer, thereby forming first recesses in the first layer;
  removing the remaining resist layer, thereby forming ridges of the first layer between the first recesses of the first;
  subjecting the first layer to a first dry etching process, wherein the first dry etching process comprises:
  subjecting the first layer to a particle beam;
  whereby selective etching of the ridges of the first layer relative to walls of the first recesses in the layer is achieved such that second recesses in the first layer are formed, the second recesses in the first layer having openings at the ridges of the first layer;

thereby a nanostructure consisting of a plurality of first fins delimited by the first and second recesses in the first layer are formed, the first fins having a first pitch.

2. The method according to claim 1, wherein the provided substrate further comprises a hardmask layer arranged directly beneath the first layer, wherein the acts of etching the exposed areas of the first layer and subjecting the first layer to the dry etching are performed such that the hardmask layer is exposed.

3. The method according to claim 2, wherein the provided substrate further comprises a second layer, wherein the hardmask layer is arranged in between the first and second layers, wherein the method further comprises:
removing the hardmask layer between the first fins, thereby exposing areas of the second layer;
etching the exposed areas of the second layer, thereby forming first recesses in the second epitaxially grown layer;
removing the first fins and the remaining hardmask layer, thereby forming ridges of the second layer between the first recesses in the second epitaxially grown layer;
subjecting the second layer for a second dry etching process, wherein the second dry etching process comprises:
subjecting the second layer to a particle beam;
whereby selective etching of the ridges of the second layer relative to walls of the first recesses in the second layer is achieved such that second recesses in the second layer are formed, the second recesses having openings at the ridges of the second layer;
thereby a nanostructure consisting of a plurality of second fins delimited by the first and second recesses in the second layer are formed, the second fins having a second pitch being narrower than the first pitch.

4. The method according to claim 3, wherein the second pitch is half of the first pitch.

5. The method according to claim 1, wherein the first dry etching process is a maskless Atomic Layer Etching process comprising a first cyclic etch process where each cycle comprises subjecting the first layer to surface modification and subjecting the first layer to the particle beam.

6. The method according to claim 5, wherein etch steps in the first cyclic etch process are separated with purge steps in such a way that the etch pulses overlap in time and space such that purge steps are reduced or removed.

7. The method according to claim 5, wherein the first cyclic etch process comprises a parallel continuous etch process and the etch partly saturates with time during process steps.

8. The method according to claim 5, wherein the first cyclic etch process comprises a parallel continuous deposition process and the etch partly saturates with time during process steps.

9. The method according to claim 3, wherein the second dry etching process is a maskless Atomic Layer Etching process comprising a second cyclic etch process where each cycle comprises subjecting the second layer to surface modification and subjecting the second epitaxially grown layer to the particle beam.

10. The method according to claim 9, wherein etch steps in the second cyclic etch process are separated with purge steps in such a way that the etch pulses overlap in time and space such that purge steps are reduced or removed.

11. The method according to claim 9, wherein the second cyclic etch process comprises a parallel continuous etch process and the etch partly saturates with time during process steps.

12. The method according to claim 9, wherein the second cyclic etch process comprises a parallel continuous deposition process and the etch partly saturates with time during process steps.

13. The method according to claim 1, further comprising passivating or coating the nanostructure by an oxide, nitride or gas phase doping before the first dry etching process.

14. The method according to claim 3, further comprising passivating or coating the nanostructure by an oxide, nitride or gas phase doping before the second dry etching process.

* * * * *